United States Patent
Aytur et al.

(10) Patent No.: US 7,095,994 B1
(45) Date of Patent: Aug. 22, 2006

(54) METHOD AND APPARATUS FOR DYNAMIC BIASING OF BASEBAND CIRCUITRY IN A COMMUNICATION SYSTEM RECEIVER

(75) Inventors: Turgut Sefket Aytur, Plattsburgh, NY (US); Nathan R. Belk, Scotch Plains, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 450 days.

(21) Appl. No.: 10/305,584

(22) Filed: Nov. 27, 2002
(Under 37 CFR 1.47)

(51) Int. Cl.
*H04B 1/06* (2006.01)
*H04L 27/08* (2006.01)
*H03F 3/04* (2006.01)

(52) U.S. Cl. .............. 455/234.1; 455/343.1; 455/574; 375/345; 330/296

(58) Field of Classification Search ............. 455/226.1, 455/226.2, 226, 232.1, 234.1, 250.1, 251.1, 455/334, 340, 341, 343.1, 574; 330/253, 330/282, 296, 254; 375/345, 346
See application file for complete search history.

(56) References Cited

U.S. PATENT DOCUMENTS

| | | | |
|---|---|---|---|
| 5,410,273 A * | 4/1995 | Brehmer et al. ............ 330/253 |
| 5,483,691 A * | 1/1996 | Heck et al. ............... 455/234.2 |
| 5,570,064 A * | 10/1996 | Sugawara ................... 330/282 |
| 5,627,857 A | 5/1997 | Wilson | |
| 5,670,912 A * | 9/1997 | Zocher ....................... 330/296 |
| 5,946,607 A * | 8/1999 | Shiino et al. ............. 455/234.1 |
| 5,974,095 A | 10/1999 | Kitaura et al. | |
| 6,154,503 A | 11/2000 | Strolle | |
| 6,175,279 B1 * | 1/2001 | Ciccarelli et al. ........... 330/296 |
| 6,181,201 B1 | 1/2001 | Black | |
| 6,670,901 B1 * | 12/2003 | Brueske et al. .......... 455/232.1 |
| 6,763,228 B1 * | 7/2004 | Prentice et al. .......... 455/234.1 |
| 6,768,379 B1 * | 7/2004 | Umeda et al. .............. 330/254 |

OTHER PUBLICATIONS

Maxim QuickView Data Sheet, MAX2700, MAX2701—1.8GHz to 2.5GHz, Direct-Downconversion Receivers, First Direct-Conversion Receiver for Wideband Wireless Local Loop, http://dbserv.maxim-ic.com/quick_view2.cfm?qv_pk=2238, 2 pages, 2001.

* cited by examiner

*Primary Examiner*—Quochien B. Vuong

(57) ABSTRACT

Baseband receiver circuitry is dynamically biased in a communication system receiver by generating gain control information, and controlling an adjustable bias of at least a portion of the baseband circuitry based at least in part on the gain control information. The baseband receiver circuitry comprises at least one amplifier having an adjustable bias associated therewith, with the adjustable bias of the amplifier being controllable utilizing a bias control signal. For example, the amplifier may be an operational amplifier having a gain stage and an output buffer stage, with the bias control signal being applied to the output buffer stage to control an adjustable bias current thereof. More specifically, the bias control signal may be used to control an amount of current provided by at least one of a plurality of current sources associated with the output buffer stage of the amplifier, for example, by controlling a switch which enables or disables one or more of the current sources. Advantageously, the dynamic bias control can substantially reduce power consumption in the receiver. The techniques of the invention can also be applied to other types of devices which utilize gain control.

14 Claims, 3 Drawing Sheets

METHOD AND APPARATUS FOR DYNAMIC BIASING OF BASEBAND CIRCUITRY IN A COMMUNICATION SYSTEM RECEIVER

FIELD OF THE INVENTION

The present invention relates generally to communication system receivers or other devices utilizing gain control, and more particularly to biasing techniques for use in baseband amplifiers or other circuitry in a communication system receiver or other device.

BACKGROUND OF THE INVENTION

Communication system receivers commonly utilize automatic gain control (AGC) techniques to control gain in one or more receiver stages. For example, a typical receiver includes front end circuitry and baseband circuitry, each of which may have one or more separate AGC circuits associated therewith. Such AGC circuits are commonly utilized to adjust the gain of one or more amplifiers in a given signal path so as to maintain desired signal level ranges for the path in the presence of variations in received signal strength.

An example of a known AGC circuit is described in U.S. Pat. No. 6,181,201, issued Jan. 30, 2001 to Peter J. Black and entitled "Automatic Gain Control Circuit for Controlling Multiple Variable Gain Amplifier Stages While Estimating Signal Power," which is incorporated by reference herein.

It is also known that certain amplifiers can be configured with an adjustable bias current. An example of such an arrangement is described in U.S. Pat. No. 6,175,279, issued Jan. 16, 2001 to Steven C. Ciccarelli et al. and entitled "Amplifier With Adjustable Bias Current," which is incorporated by reference herein.

A drawback of existing communication system receivers is the amount of power consumed by the receiver baseband circuitry. In a typical receiver, amplifiers in the baseband circuitry are biased at a substantially constant level, resulting in a certain amount of power consumption. Information that may be known regarding signal strength is generally not utilized to adjust the bias level in the baseband circuitry, with the result that this circuitry may consume an unduly high amount of power under certain operating conditions.

A need therefore exists for improved techniques for controlling bias in baseband circuitry of a communication system receiver or other device.

SUMMARY OF THE INVENTION

In accordance with one aspect of the invention, baseband receiver circuitry is dynamically biased in a communication system receiver by generating gain control information, and controlling an adjustable bias of at least a portion of the baseband circuitry based at least in part on the gain control information.

The baseband receiver circuitry may comprise at least one amplifier having an adjustable bias associated therewith, with the adjustable bias of the amplifier being controllable utilizing a bias control signal. For example, the amplifier may be an operational amplifier having a gain stage and an output buffer stage, with the bias control signal being applied to the output buffer stage to control an adjustable bias current thereof. More specifically, the bias control signal may be used to control an amount of current provided by at least one of a plurality of current sources associated with the output buffer stage of the amplifier, for example, by controlling a switch which enables or disables one or more of the current sources.

In an illustrative embodiment of the invention, an operational amplifier with dynamic bias control in accordance with the invention comprises a gain stage and an output buffer stage, with the output buffer stage comprising at least a first current source providing a first level of current for the output buffer stage and a second current source providing a second level of current for the output buffer stage. The second level of current is greater than the first level of current, and a bias control signal is utilized to enable or disable the second current source based on gain control settings or other gain control information generated in the baseband circuitry.

The techniques of the invention can be adapted for use in providing dynamic bias control for operational amplifiers in filter circuits, variable gain amplifier circuits or other circuits of a given set of baseband circuitry, as well as for other types of amplifier or non-amplifier circuits.

Advantageously, by providing improved control of baseband circuitry bias based on gain control information, the invention can significantly reduce power consumption in a communication system receiver.

The invention can be utilized in a wide variety of communication system receivers, including, for example, receivers associated with wireless networks such as IEEE 802.11 networks, digital audio broadcasting (DAB) systems, etc.

The techniques of the invention can also be applied to signal channel circuitry other than baseband circuitry, in devices other than communication system receivers. More particularly, in accordance with another aspect of the invention, signal channel circuitry is dynamically biased by generating gain control information in a gain control circuit of the signal channel circuitry, and controlling an adjustable bias of at least a portion of the signal channel circuitry based at least in part on the gain control information.

DETAILED DESCRIPTION OF THE INVENTION

The present invention will be illustrated herein in an example receiver having a particular configuration of receiver baseband circuitry. It is to be appreciated, however, that the invention does not require the particular receiver and baseband circuitry configurations of the illustrative embodiments. The invention is more generally suitable for use in any communication receiver application in which it is desirable to provide improved power consumption through dynamic biasing of baseband circuitry. More particularly, the invention can be adapted for utilization in a wide variety of communication system receivers, including, for example, receivers associated with wireless networks such as IEEE 802.11 networks, digital audio broadcasting (DAB) systems, wireline systems such as digital subscriber line (DSL) systems, optical communication systems, etc. The term "receiver" as used herein is intended to encompass these and other communication system receivers. Moreover, the present invention can be implemented in other types of applications, such as disk drive read channels, which involve devices other than communication system receivers. The invention can thus be viewed as being utilizable in any circuit application involving a signal channel having gain control associated therewith.

In accordance with one aspect of the invention, techniques are provided for dynamic biasing of receiver circuitry in a receiver of a communication system. More specifically, a gain control signal or other gain control information is generated in the baseband circuitry, and an adjustable bias of at least a portion of the baseband circuitry is controlled based at least in part on the gain control information. This type of arrangement is generally referred to herein as dynamic biasing of baseband circuitry.

Figure 1:
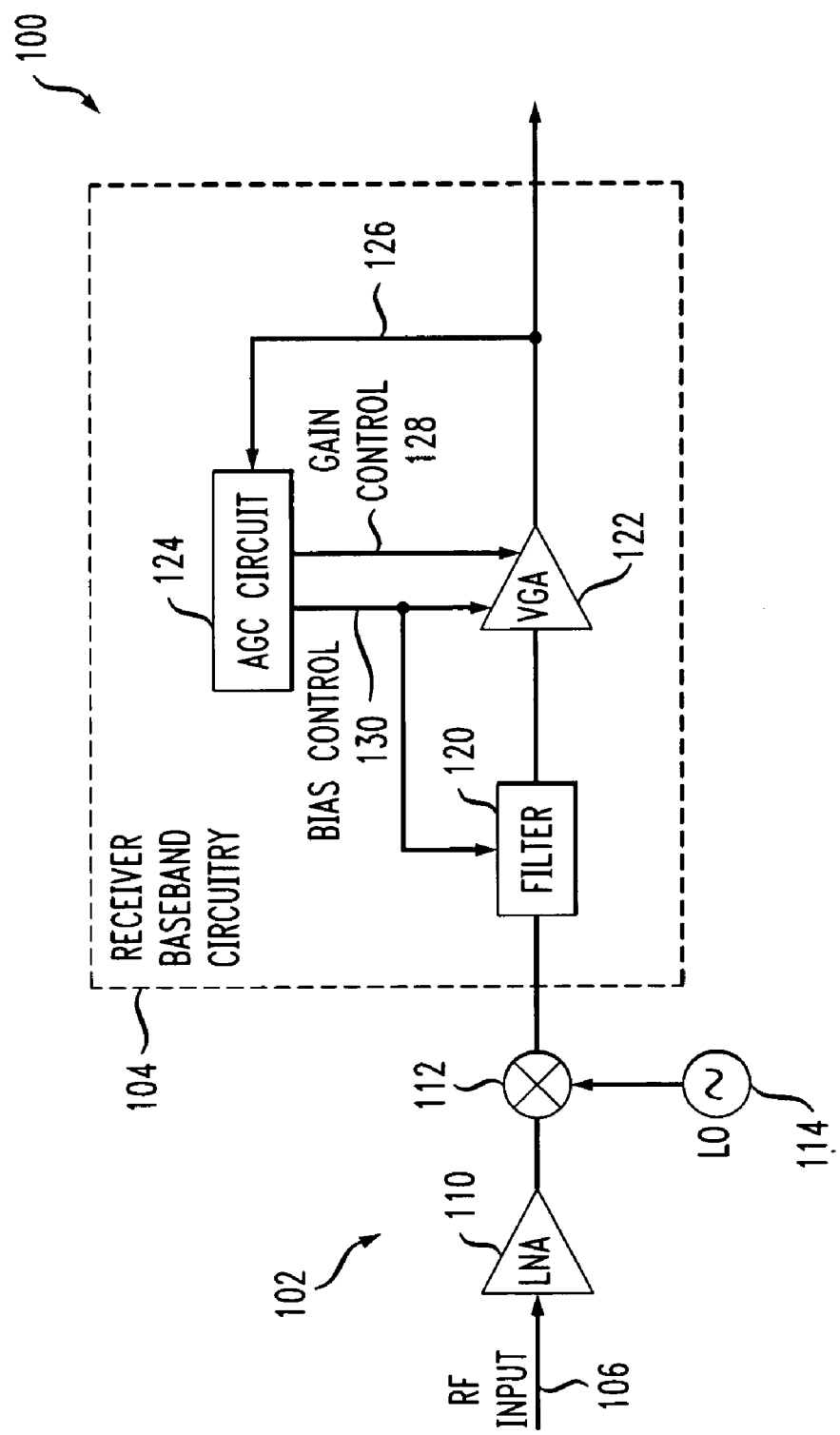
FIG. 1 is a block diagram of an example communication system receiver configured in accordance with an illustrative embodiment of the invention.

FIG. 1 shows an example of a communication system receiver 100 in which the present invention is implemented. The receiver 100 includes a "front end" portion 102 and a baseband signal processing or "back end" portion 104. The receiver back end portion 104 may be viewed as an illustrative embodiment of what is more generally referred to herein as receiver baseband circuitry.

A received radio frequency (RF) signal is applied via RF input 106 to a low noise amplifier (LNA) 110. The output of the LNA 110 is downconverted in a mixer 112 using a signal from a local oscillator (LO) 114. The downconverted signal is applied to a filter 120 in the baseband circuitry 104 and the resulting filtered signal is amplified in a variable gain amplifier (VGA) 122. An automatic gain control (AGC) circuit 124 in the baseband circuitry 104 utilizes a feedback signal 126 derived from an output of the VGA 122 to generate a gain control signal 128 which is applied to a gain control input of the VGA 122.

Techniques for generating such gain control signals are well-known in the art and therefore not further described herein. It is to be appreciated that the invention does not require the use of any particular gain control signal or other type of gain control information.

The baseband circuitry 104 in this illustrative embodiment provides dynamic bias control for one or more amplifiers in each of the filter 120 and the VGA 122. The manner in which this dynamic bias control may be provided for an example multi-stage operational amplifier will be described in greater detail below in conjunction with FIGS. 2A, 2B and 3, and it will be readily apparent to those skilled in the art that similar techniques can be applied to other types of amplifiers or other circuitry.

As shown in FIG. 1, the AGC circuit 124 generates a bias control signal 130 that is applied to a bias control input of the filter 120 and the VGA 122. This bias control signal is generated based at least in part on gain control information determined by the AGC circuit 124.

In general, such gain control information determined by the AGC circuit 124 is indicative of the signal strength along the signal path through the receiver 100 as shown in FIG. 1. For example, when received signal strength is relatively high, the gain control information will reflect this condition, and the corresponding gain control signal applied to VGA 122 will cause the gain of VGA 122 to be adjusted downward. Similarly, when received signal strength is relatively low, the gain control information will reflect this condition, and the corresponding gain control signal applied to VGA 122 will cause the gain of VGA 122 to be adjusted upward. The objective of the AGC circuit 124 is thus to control the gain of VGA 122 such that the signal strength at the output of the VGA 122 is maintained at a substantially constant level despite variations in the strength of the received signal at the RF input 106. This is desirable so as to provide proper input signal amplitude for subsequent processing circuitry, such as a baseband analog-to-digital converter, which may be driven by the output of the VGA 122.

The AGC circuit 124 in this embodiment also generates the above-noted bias control signal 130 for application to the filter 120 and VGA 122. This bias control signal is determined at least in part based on the gain control information described above, and is thus also indicative of signal strength along the corresponding signal path of the receiver 100. For example, in one possible implementation of the invention, the bias control signal may be generated by thresholding or otherwise processing the gain control signal. As another example, the bias control signal may be indicative of a gain control setting reflected by the gain control signal. It is also possible that the bias control signal and the gain control signal may be the same signal. As yet another example, the bias control signal may be a designated portion of the gain control signal, e.g., one or more specified bits of a digital gain control signal.

The bias conditions of amplifiers or other circuits in the baseband circuitry 104 are adjusted based at least in part on gain control information determined by the AGC circuit 124. The baseband circuitry bias is thus adjusted to take into account information regarding the signal strength along the corresponding signal path of the receiver 100.

Although the bias control signal 130 is shown in this illustrative embodiment as being applied to both the filter 120 and the VGA 122, this is by way of illustrative example only. In other embodiments, the bias control signal 130 may be applied to only the filter 120, or only the VGA 122, or to particular portions thereof, or to other elements of the baseband receiver circuitry 104 or receiver 100. In addition, although a single bias control signal is applied to both the filter 120 and the VGA 122 in this illustrative embodiment, it is possible to generate different bias control signals for application to different circuit elements, as well as different bias control signals for application to different portions of such elements.

It should also be noted that, although the bias control signal 130 in FIG. 1 is generated by the AGC circuit 124, this is by way of illustrative example only. In other embodiments, a separate bias control circuit may be used which receives gain control information from the AGC circuit 124 and generates the bias control signal from the gain control information. As another example, a general purpose processor or other similar element associated with the receiver 100 may process gain control information from the AGC circuit 124 to generate the bias control signal.

It is therefore to be appreciated that the receiver 100 as shown in FIG. 1 is considerably simplified for clarity of illustration. The invention does not require this particular arrangement of receiver circuitry, and numerous other arrangements can be used. For example, the VGA 122 may comprise multiple stages of amplification, each of which can be configured for dynamic bias control in accordance with the techniques of the invention. Also, other types of circuitry, in addition to or in place of one or more of the filter 120 and VGA 122, can be configured for dynamic bias control in accordance with the techniques of the invention.

It should further be noted that, as indicated previously, the techniques of the invention can be applied to signal channel circuitry other than baseband circuitry in a communication system receiver. More particularly, in accordance with another aspect of the invention, signal channel circuitry in a device other than a receiver may be dynamically biased by generating gain control information in a gain control circuit of the signal channel circuitry, and controlling an adjustable bias of at least a portion of the signal channel circuitry based at least in part on the gain control information. The baseband receiver bias control techniques described herein can be extended in a straightforward manner to the general case of dynamic biasing of signal channel circuitry.

Figure 2A:
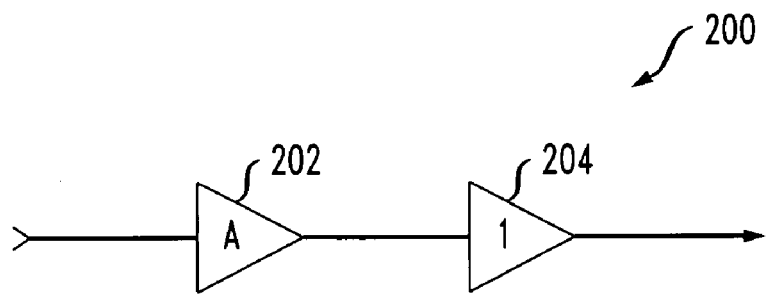
FIGS. 2A, 2B and 2C illustrate exemplary operational amplifier circuits which are modifiable in an illustrative embodiment of the invention for use in the baseband receiver circuitry of FIG. 1.
Figure 2B:
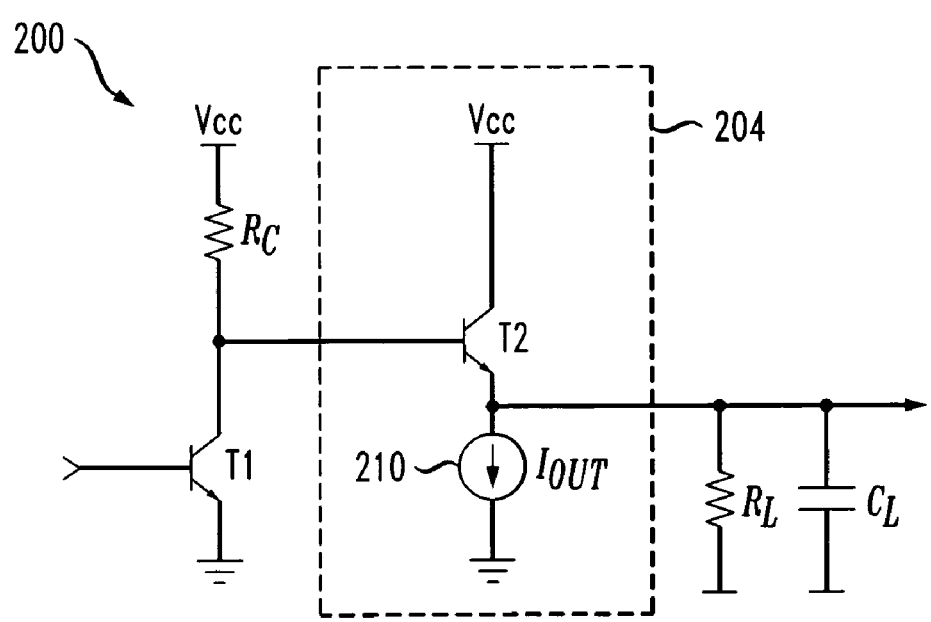

FIGS. 2A and 2B illustrate an exemplary multi-stage operational amplifier 200 which is modifiable in an illustrative embodiment of the invention for use in one or both of the filter 120 and the VGA 122 in the baseband receiver circuitry of FIG. 1.

Referring initially to FIG. 2A, the amplifier 200 includes an amplification stage 202 followed by a low-impedance output buffer stage 204. The stage 202 provides a gain denoted by "A" in the figure and the stage 204 provides substantially unity gain denoted by "1" in the figure.

FIG. 2B shows a corresponding simplified schematic diagram representative of the operational amplifier 200. The amplification stage 202 as shown comprises an n-p-n bipolar transistor T1 with its collector coupled through a resistor $R_C$ to a positive supply voltage Vcc and its emitter coupled to ground potential. The base of T1 is the input of stage 202. The collector of T1 is the output of stage 202, and is coupled to the base of another n-p-n transistor T2 in the low-impedance output buffer stage 204. The collector of T2 is coupled to the supply voltage Vcc, and the emitter of T2 is coupled via a current source 210 to ground potential. The output of the stage 204 is taken from the emitter of T2. Coupled in parallel with the current source 210 are a load resistance $R_L$ and a load capacitance $C_L$.

As will be appreciated by those skilled in the art, the current $I_{OUT}$ associated with the current source 210 in the output buffer stage 204 is separately determinable under large signal and small signal conditions. Under large signal conditions, the current $I_{OUT}$ is given by:

$$I_{OUT} = \frac{V_{IN,MAX}}{R_L},$$

where $V_{IN, MAX}$ denotes the maximum input voltage applied to the base of transistor T2 in the output buffer stage 204. Therefore, under large signal conditions, $I_{OUT}$ is independent of the load capacitance $C_L$ and the signal frequency co. In general, the large signal $I_{OUT}$ as given by the above equation represents about 75% of the total current in the operational amplifier 200. Under small signal conditions, $I_{out}$ is independent of the input voltage $V_{IN}$, and is instead proportional to the product of the load capacitance $C_L$ and the maximum signal frequency $\omega_{MAX}$, as follows:

$$I_{OUT} \cong C_L V_T \omega_{MAX} \propto C_L \omega_{MAX},$$

where $V_T$ is approximately 25 millivolts at room temperature. It is therefore apparent that the current $I_{OUT}$ can be separately optimized for large signal and small signal conditions, based on the equations given above. In one possible implementation, the large signal component of the current $I_{OUT}$ may be greater than about 1 milliamp, while the small signal component of the current $I_{OUT}$ may be less than about 200 microamps.

Figure 2C:
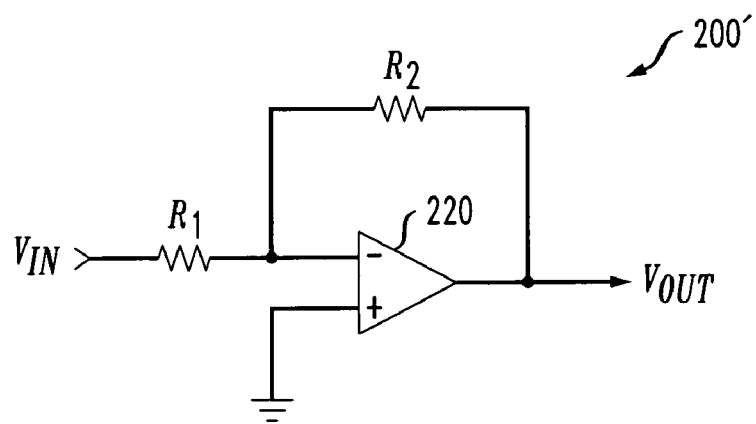

FIG. 2C shows by way of illustrative example a simplified view of an operational amplifier circuit 200', which includes an operational amplifier 220. The operational amplifier 220 may correspond generally to the multi-stage operational amplifier 200 described in conjunction with FIGS. 2A and 2B. As shown in FIG. 2C, an input resistor $R_1$ is coupled between an input terminal denoted $V_{IN}$ and an inverting input of the amplifier 220, and a feedback resistor $R_2$ is coupled between an output terminal denoted $V_{OUT}$ and the inverting input of the amplifier 220. The non-inverting input of the operational amplifier 220 is coupled to ground potential. In this configuration, the output current $I_{OUT}$ is proportional to the output voltage $V_{OUT}$, and its maximum value $I_{OUT, MAX}$ is given by:

$$I_{OUT,MAX} = \frac{V_{OUT,MAX}}{R_2},$$

where $V_{OUT, MAX}$ denotes the maximum output voltage.

In accordance with the invention, the output current $I_{OUT}$ associated with a given operational amplifier circuit, such as one of the circuits described in conjunction with FIGS. 2A, 2B and 2C, can be adjusted by controlling amplifier bias based at least in part on gain control information, so as to better match the amplifier bias to the signal strength on the corresponding signal path of the receiver 100.

Figure 3:
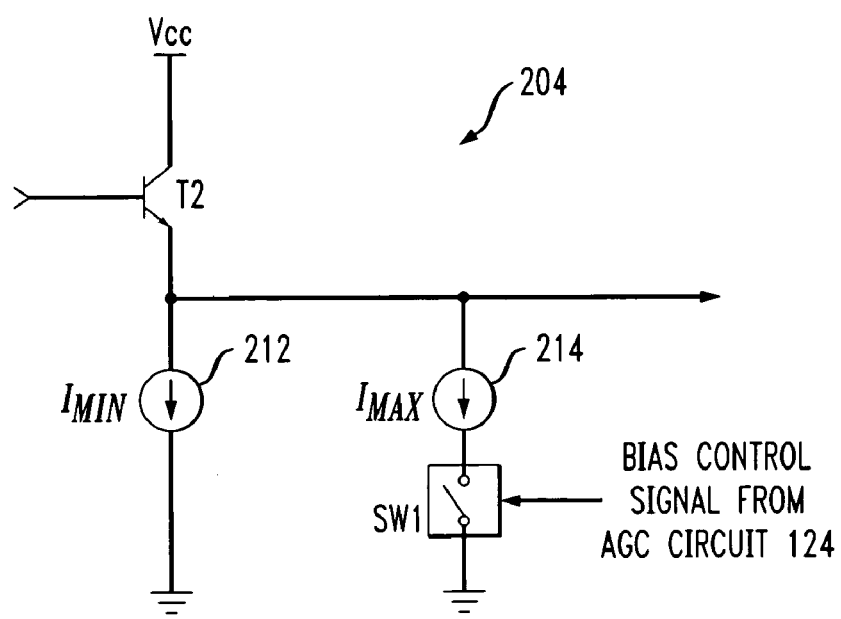
FIG. 3 shows a portion of the operational amplifier of FIG. 2B as modified to incorporate a dynamic biasing feature in accordance with an illustrative embodiment of the invention.

FIG. 3 shows the output buffer stage 204 of the operational amplifier 200 of FIG. 2B as modified to incorporate a dynamic biasing feature in accordance with an illustrative embodiment of the invention. In the figure, the bias control signal 130 from the AGC circuit 124 is applied to a control input of a switch SW1 which enables or disables one of a plurality of current sources associated with the output stage 204 of the amplifier 200. More specifically, the output buffer stage 204 includes at least a first current source 212 providing a first level of current $I_{MIN}$ for the output buffer stage 204 and a second current source 214 providing a second level of current $I_{MAX}$ for the output buffer stage 204. The second level of current $I_{MAX}$ is greater than the first level of current $I_{MIN}$.

In operation, the bias control signal applied to the switch SW1 is operative to enable or disable the second current source 214 based at least in part on gain control information from the AGC circuit 124. Advantageously, this allows the current consumed by the operational amplifier 200 to be considerably reduced in situations in which the received signal strength is high and the adjustable gain control setting is low.

It is to be appreciated that the particular bias control circuitry of FIG. 3 is shown by way of illustrative example only, and numerous alternative arrangements of bias control circuitry can be used to implement the techniques of the invention. For example, other arrangements of switches or other control circuitry may be used, as well as alternative controllable current or voltage sources.

A dynamic bias control technique such as that described above can be implemented at multiple locations in a given set of baseband circuitry. For example, each of the operational amplifiers in the filter 120 and VGA 122 can be configured such that their output buffer stages are controllable in the manner illustrated in FIG. 3.

In another illustrative embodiment of the invention, VGA 122 includes multiple variable gain amplifier stages, e.g., three separate variable gain amplifier stages, each of which may comprise one or more operational amplifiers, such as the operational amplifier 200 described in conjunction with FIGS. 2A and 2B, and may include a dynamically controllable bias feature such as that described in conjunction with FIG. 3. As noted above, the bias control signal may be a designated portion of the gain control signal, e.g., one or more specified bits of a digital gain control signal.

In this illustrative embodiment, each of the three variable gain amplifier stages has an adjustable gain that is controllable by three bits of a nine-bit digital gain control signal. The adjustable gain for each of the variable gain amplifier stages can therefore be set to one of $2^3=8$ different gain levels. In accordance with the invention, the most significant bit (MSB) in each of the three-bit groups is utilized not only for setting the variable gain for the corresponding amplifier stage, but is also utilized for bias control for that stage. More specifically, the MSB of the three-bit group of gain control signal bits for a given one of the three variable gain amplifier stages is applied as a control input to a switch such as SW1 or other suitable bias control circuitry in the given stage. Therefore, in this embodiment, each of the stages uses the MSB of its corresponding gain control signal bits to provide bias control in accordance with the techniques of the invention.

In general, in a VGA with n stages of variable gain amplification, controllable using a total of m digital gain control signal bits, with a particular group of m/n digital gain control signal bits being used to select one of $2^{m/n}$ gain levels in a corresponding one of the n stages, one or more bits of each of the n groups of m/n gain control signal bits are used to adjust the bias in a corresponding one of the n stages. Numerous other arrangements of gain control and bias control signals, and associated circuitry, can be used.

The dynamic bias control techniques of the present invention can be extended to other types of amplifier circuits as well as non-amplifier circuits in a a given set of baseband circuitry. These techniques can thus be implemented in a number of different locations in the baseband circuitry of a communication system receiver, or in a non-receiver device which utilizes gain control.

The above-described embodiments of the invention are intended to be illustrative only. For example, the embodiment illustrated in FIG. 1 may be implemented using a wide variety of RF and intermediate frequency (IF) processing elements, or alternative receiver architectures, using configurations other than that shown, as will be readily appreciated by those skilled in the art. More specifically, the invention can be implemented in receivers which utilize in-phase (I) and quadrature (Q) signal paths or other types of multi-phase processing. The particular techniques given above for generation of bias control signals and the use of such control signals to adjust amplifier bias in baseband circuitry are by way of non-limiting examples, and can be varied in a straightforward manner to utilize other signal and circuitry configurations.

Furthermore, as indicated previously, the invention is not limited for use with baseband receiver circuitry, and can be implemented in other applications involving gain control circuitry. For example, the invention can be used for dynamic biasing of signal channel circuitry in a device other than a communication system receiver, by generating gain control information in a gain control circuit of the signal channel circuitry, and controlling an adjustable bias of at least a portion of the signal channel circuitry based at least in part on the gain control information.

These and numerous other alternative embodiments and implementations within the scope of the following claims will be apparent to those skilled in the art.

We claim:

1. A method for dynamic biasing of receiver circuitry in a receiver of a communication system, the method comprising the steps of:
   generating gain control information in baseband circuitry of the receiver; and
   controlling an adjustable bias of at least a portion of the baseband circuitry based at least in part on the gain control information;
   wherein the baseband receiver circuitry comprises at least one amplifier having an adjustable bias associated therewith, the adjustable bias of the amplifier being controllable utilizing a bias control signal;
   wherein the amplifier comprises a gain stage and an output buffer stage, and the bias control signal is applied to the output buffer stage to control an adjustable bias current thereof based at least in part on the gain control information.

2. The method of claim 1 wherein the generating step further comprises generating a gain control signal indicative of a gain control setting associated with the baseband circuitry.

3. The method of claim 1 wherein the controlling step further comprises utilizing a gain control signal to generate the bias control signal for application to the output buffer stage of the amplifier in the baseband circuitry.

4. The method of claim 1 wherein the bias control signal applied to the output buffer stage of the amplifier in the baseband circuitry controls an amount of current provided by at least one of a plurality of current sources associated with the amplifier.

5. The method of claim 1 wherein the bias control signal is applied to a control input of a switch which enables or disables one or more of a plurality of current sources associated with the amplifier in the baseband circuitry.

6. The method of claim 5 wherein the output buffer stage of the amplifier comprises at least a first current source providing a first level of current for the output buffer stage and a second current source providing a second level of current for the output buffer stage, the second level of current being greater than the first level of current, wherein the bias control signal enables or disables at least the second current source.

7. The method of claim 1 wherein the receiver baseband circuitry comprises at least one variable gain amplifier circuit comprising said at least one amplifier.

8. The method of claim 1 wherein the receiver baseband circuitry comprises at least one filter circuit comprising said at least one amplifier.

9. The method of claim 1 wherein the bias control signal comprises one or more specified bits of a digital gain control signal.

10. A method for dynamic biasing of receiver circuitry in a receiver of a communication system, the method comprising the steps of:
    generating gain control information in baseband circuitry of the receiver; and
    controlling an adjustable bias of at least a portion of the baseband circuitry based at least in part on the gain control information;
    wherein the baseband circuitry comprises n stages of variable gain amplification, controllable using a total of m digital gain control signal bits, with a particular group of m/n digital gain control signal bits being used to select one of $2^{m/n}$ gain levels in a corresponding one of the n stages, and wherein one or more bits of the particular group of m/n gain control signal bits are used to adjust the bias in the corresponding one of the n stages.

11. The method of claim 10 wherein a most significant bit of the particular group of m/n gain control signal bits is used to adjust the bias in the corresponding one of the n stages.

12. An apparatus for use in a receiver of a communication system, the apparatus comprising:

baseband receiver circuitry comprising a gain control circuit for generating gain control information, at least a portion of the baseband receiver circuitry having an adjustable bias which is controllable based at least in part on the gain control information;

wherein the baseband receiver circuitry comprises at least one amplifier having an adjustable bias associated therewith, the adjustable bias of the amplifier being controllable utilizing a bias control signal;

wherein the amplifier comprises a gain stage and an output buffer stage, and the bias control signal is applied to the output buffer stage to control an adjustable bias current thereof based at least in part on the gain control information.

13. A method for dynamic biasing of signal channel circuitry, the method comprising the steps of:

generating gain control information in a gain control circuit of the signal channel circuitry; and controlling an adjustable bias of at least a portion of the signal channel circuitry based at least in part on the gain control information;

wherein the signal channel circuitry comprises at least one amplifier having an adjustable bias associated therewith, the adjustable bias of the amplifier being controllable utilizing a bias control signal;

wherein the amplifier comprises a gain stage and an output buffer stage, and the bias control signal is applied to the output buffer stage to control an adjustable bias current thereof based at least in part on the gain control information.

14. The method of claim 13 wherein the signal channel circuitry comprises baseband receiver circuitry in a communication system receiver.

\* \* \* \* \*